United States Patent
Kim et al.

(10) Patent No.: US 10,475,646 B2
(45) Date of Patent: Nov. 12, 2019

(54) PROCESS FOR PRODUCING OF POLYCRYSTALLINE SILICON

(71) Applicant: OCI Company Ltd., Seoul (KR)

(72) Inventors: Chang Ryol Kim, Gyeonggi-do (KR); A Youn Cho, Gyeonggi-do (KR); Ja Cheol Koo, Gyeonggi-do (KR); Yong Chul Shin, Gyeonggi-do (KR)

(73) Assignee: OCI COMPANY LTD., Seoul (KR)

( * ) Notice: Subject to any disclaimer, the term of this patent is extended or adjusted under 35 U.S.C. 154(b) by 0 days.

(21) Appl. No.: 15/887,069

(22) Filed: Feb. 2, 2018

(65) Prior Publication Data
US 2018/0226249 A1    Aug. 9, 2018

(30) Foreign Application Priority Data
Feb. 3, 2017 (KR) .................. 10-2017-0015479

(51) Int. Cl.
| | |
|---|---|
| B01D 53/86 | (2006.01) |
| G05B 21/00 | (2006.01) |
| C01B 33/039 | (2006.01) |
| B01J 8/18 | (2006.01) |
| C01B 33/021 | (2006.01) |
| C01B 33/107 | (2006.01) |
| H01L 21/02 | (2006.01) |
| C01B 33/03 | (2006.01) |
| C23C 16/24 | (2006.01) |
| C23C 16/44 | (2006.01) |
| C23C 16/448 | (2006.01) |
| C23C 16/455 | (2006.01) |

(52) U.S. Cl.
CPC ........ *H01L 21/02595* (2013.01); *C01B 33/03* (2013.01); *C01B 33/1071* (2013.01); *C23C 16/24* (2013.01); *C23C 16/4402* (2013.01); *C23C 16/448* (2013.01); *C23C 16/45593* (2013.01); *H01L 21/0262* (2013.01); *H01L 21/02532* (2013.01)

(58) Field of Classification Search
CPC ...... B01D 3/14; B01D 5/0054; B01D 53/002; C01B 33/03; C01B 33/107
See application file for complete search history.

(56) References Cited

U.S. PATENT DOCUMENTS

| | | | | |
|---|---|---|---|---|
| 2009/0142246 A1* | 6/2009 | Masuda | ................... | B01D 3/14 423/342 |
| 2011/0306187 A1* | 12/2011 | Dold | .................... | C01B 33/037 438/478 |
| 2012/0177558 A1* | 7/2012 | Kamei | .................. | C01B 33/035 423/348 |
| 2015/0030520 A1* | 1/2015 | Dassel | .............. | C01B 33/10763 423/342 |
| 2015/0158732 A1* | 6/2015 | Gandhi | ............... | C01B 33/1071 423/342 |
| 2016/0152481 A1* | 6/2016 | Ashworth | ............. | C01B 33/039 423/348 |

* cited by examiner

*Primary Examiner* — Brian Turner
(74) *Attorney, Agent, or Firm* — Fay Sharpe LLP

(57) ABSTRACT

The present invention relates to a process for producing of polycrystalline silicon, and the method includes (1) preparing a silicon-containing gas; (2) storing the silicon-containing gas in a storage tank; (3) depositing polycrystalline silicon by injecting the silicon-containing gas stored in the storage tank to a CVD reactor; (4) treating an off-gas emitted in the depositing step; and (5) injecting the gas treated in the treating step to the storage tank.

20 Claims, 4 Drawing Sheets

[FIG. 1]
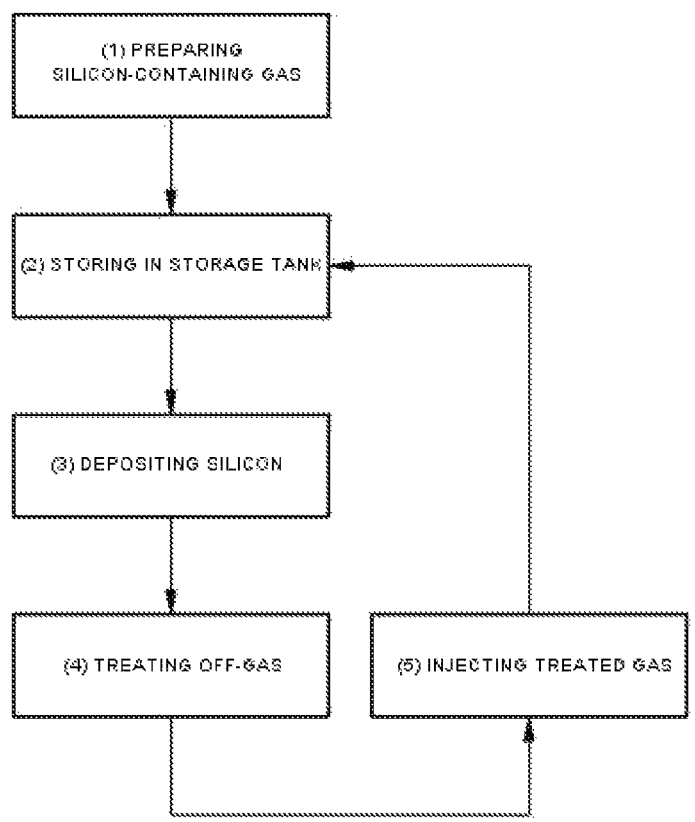

[FIG. 2]
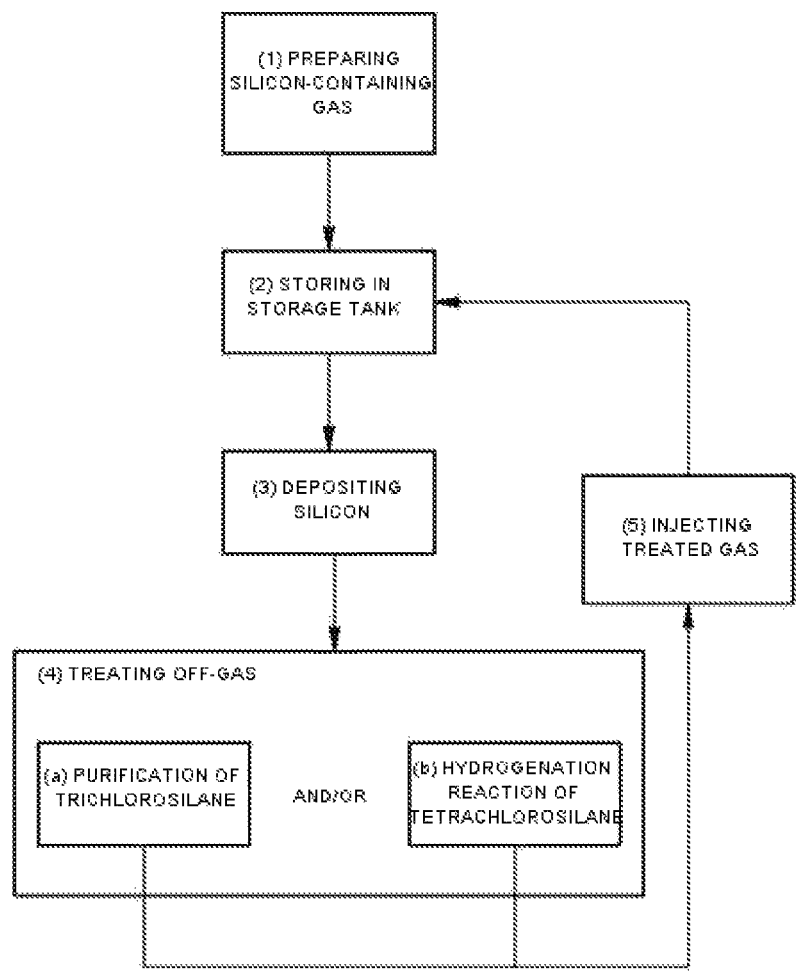

【FIG. 3】
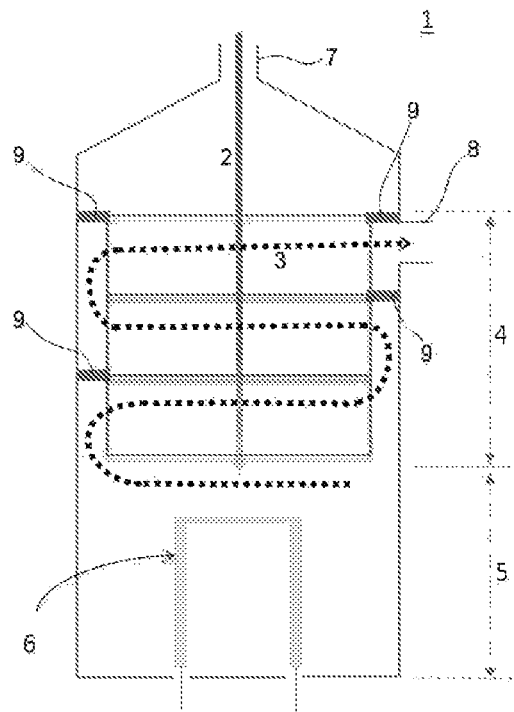
【FIG. 4】
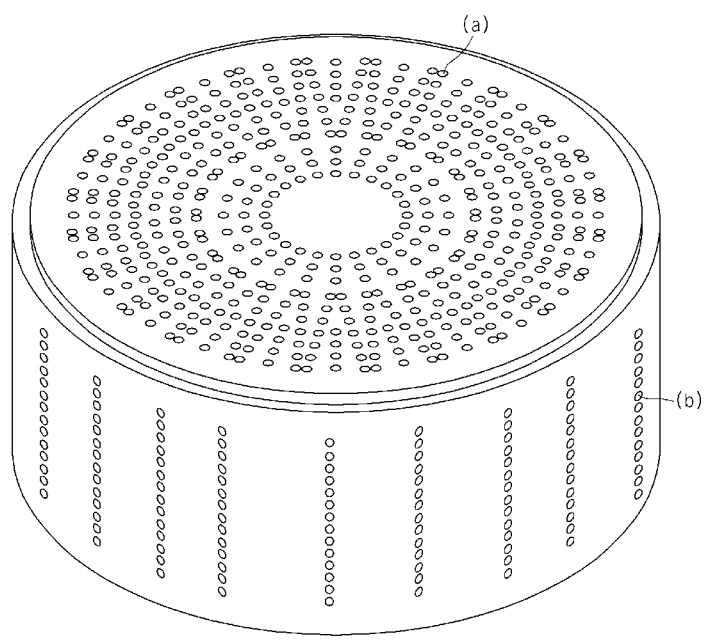

[FIG. 5]
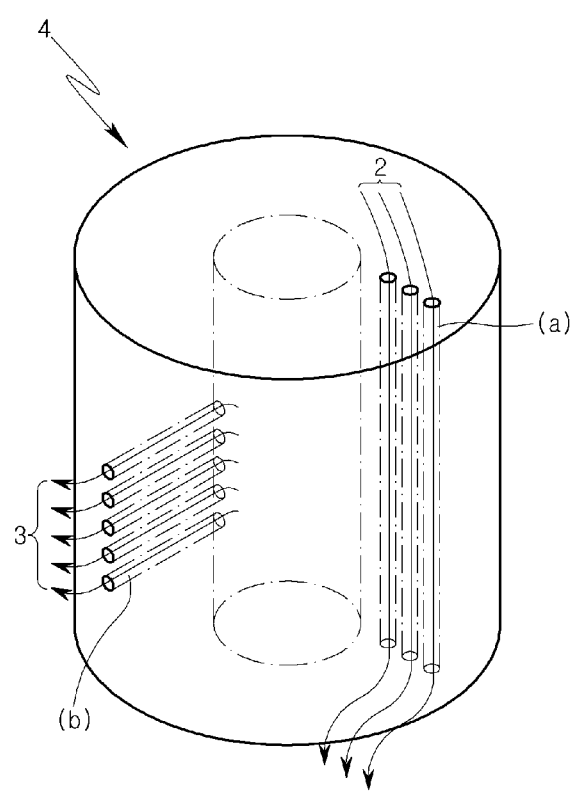

PROCESS FOR PRODUCING OF POLYCRYSTALLINE SILICON

CROSS-REFERENCE TO RELATED APPLICATION(S)

This application claims priority to Korean Patent Application No 10-2017-0015479, filed on Feb. 3, 2017, the disclosure of which is incorporated herein by reference in its entirety.

BACKGROUND OF THE INVENTION

Field of the Invention

The present invention relates to a process for producing of polycrystalline silicon.

Description of the Related Art

Polycrystalline silicon is a material forming a substrate of a semiconductor and a solar cell such as a wafer. This polycrystalline silicon is typically produced by a Siemens method, and this method uses a principle of heating a filament rod mainly made of silicon by applying a current thereto in a bell-type chemical vapor deposition (CVD) reactor, and introducing a raw material gas including a silicon-containing component and hydrogen to deposit silicon on the filament rod.

The silicon-containing component of the raw material used herein is generally halosilane of $SiH_nX_{4-n}$ (n=0, 1, 2, 3; X=Cl, Br, I). Chlorosilane or a chlorosilane mixture is preferred, and unreacted trichlorosilane and hydrogen among the components included in an off-gas emitted from the CVD reactor are capable of being used as a raw material in a polycrystalline silicon preparation process, and collecting and recycling these has an advantage of reducing polycrystalline silicon preparation costs.

SUMMARY OF THE INVENTION

The present invention is directed to providing a method of obtaining high purity trichlorosilane by treating an unreacted silicon-containing gas among components included in an off-gas emitted from a CVD reactor, and then using the trichlorosilane again in a depositing step to recycle a part or all of the gases included in byproducts produced continuously in an existing process for producing of polycrystalline silicon.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

One embodiment of the present invention provides a method for preparing polycrystalline silicon including (1) preparing a silicon-containing gas; (2) storing the silicon-containing gas in a storage tank; (3) depositing polycrystalline silicon by injecting the silicon-containing gas stored in the storage tank to a CVD reactor; (4) treating an off-gas emitted in the depositing step (3); and (5) injecting the gas treated in the treating step (4) to the storage tank.

BRIEF DESCRIPTION OF THE DRAWINGS

The above and other objects, features and other advantages of the present invention will be more clearly understood from the following detailed description taken in conjunction with the accompanying drawings, in which:

FIG. 1 illustrates a process chart of a process for producing polycrystalline silicon according to the present invention.

FIG. 2 illustrates a process chart of a process for producing of polycrystalline silicon according to an additional embodiment of the present invention.

FIG. 3 illustrates a dechlorination reactor according to the present invention.

FIG. 4 illustrates a heat exchanger provided in the dechlorination reactor according to the present invention.

FIG. 5 is a perspective view of the heat exchanger according to the present invention.

DESCRIPTION OF SPECIFIC EMBODIMENTS

One embodiment of the present invention provides a process for producing of polycrystalline silicon. Specifically, the method includes (1) preparing a silicon-containing gas; (2) storing the silicon-containing gas in a storage tank; (3) depositing polycrystalline silicon by injecting the silicon-containing gas stored in the storage tank to a CVD reactor; (4) treating an off-gas emitted in the depositing step (3); and (5) injecting the gas treated in the treating step (4) to the storage tank.

The present invention provides a silicon-containing gas required in the depositing step by recycling an off-gas emitted in the step (3). More specifically, a great quantity of tetrachlorosilane and unreacted trichlorosilane which are produced as byproducts in the step of depositing step may be included in the off-gas, and the present invention uses the unreacted trichlorosilane again in the depositing step. Furthermore, process efficiency is maximized by using byproducts produced in the process of each step as reactants in other steps in the present invention.

In the present invention, the treated gas obtained in the step (4) (reactants obtained from dechlorinating unreacted trichlorosilane and/or a great quantity of tetrachlorosilane wherein the trichlorosilane-containing gas is major is injected to the storage tank of the step (2). As a result, the silicon-containing gas and the treated gas injected afterward are mixed in the storage tank, and this mixture gas is injected to a CVD reactor. Accordingly, a content ratio and an absolute quantity of the silicon in the mixture gas injected to the CVD reactor increase ultimately with increasing yield efficiency of polycrystalline silicon.

In addition, in a polycrystalline silicon preparation process, tetrachlorosilane is produced as a byproduct. And the tetrachlorosilane must be eliminated by a process which requires lots of energy and must be separated from the off-gas. The present invention is capable of solving the above-mentioned problems through continuously converting tetrachlorosilane to trichlorosilane so that it can provide a silicon source stably and increase yield of polycrystalline silicon.

The process of preparing a silicon-containing gas used in the depositing process and the process of depositing polycrystalline silicon by injecting the silicon-containing gas to a CVD reactor may be operated individually and independently, thereby, efficiency may be enhanced. For examples, the whole process can be continuously progressed without stopping even when some processes are broken down or under repairs.

FIG. 1 is a process chart of a process for producing of polycrystalline silicon according to the present invention, and indicates a direction of flow of processes.

The preparing of a silicon-containing gas, the step (1), is a step of preparing a silicon-containing gas as a raw material for depositing polycrystalline silicon. The silicon-containing gas includes halosilane, preferably, chlorosilane, and mostly used chlorosilane is trichlorosilane.

The silicon-containing gas may be obtained from MG-Si-metallurgical grade silicon present in nature through physical/chemical treatment, and in the present invention, the silicon-containing gas is obtained by reacting MG-Si powder and hydrogen chloride in a fluidized reactor. The silicon-containing gas may be a mixture of trichlorosilane, dichlorosilane, tetrachlorosilane, hydrogen chloride and the like.

In the step (2), the silicon-containing gas prepared in the step (1) is stored in a storage tank before being injected to a CVD reactor. The silicon-containing gas may be treated to become high purity trichlorosilane through an additional distillation process, and purity of the trichlorosilane gone through the distillation process is 95% or greater, and more preferably greater than 99%. Particularly, quality of polycrystalline silicon to be deposited and impurity content are determined by the purity of such trichlorosilane, and the impurity content may be dramatically reduced when using trichlorosilane having high purity by the present invention. For example, when purity of trichlorosilane is 90% or less, the rate is low when depositing polycrystalline silicon, and the deposited form may not be uniform due to an impurity increase.

The storage tank may include one or more inlets and one or more outlets. The inlet is a path for supplying the silicon-containing gas and/or a gas treated from an off-gas, and the outlet is a path for transporting the gas stored in the storage tank to a CVD reactor.

In the step (3), polycrystalline silicon is deposited by injecting the silicon-containing gas stored in the storage tank to a CVD reactor. Some of the silicon-containing gas reacts with hydrogen in the CVD reactor to be deposited as polycrystalline silicon, and other unreacted silicon-containing gas and unreacted hydrogen are emitted as an off-gas.

The silicon-containing gas is transported through a pipe connecting the CVD reactor and the storage tank. The CVD reactor and the storage tank may be present in plural numbers, and the CVD reactor and the storage tank may be serially connected to each other in 1:1 or multi:multi through one or more pipes. Alternatively, the CVD reactor and the storage tank may have a form of multi:1 or 1:multi such that a plurality of pipes extended from the CVD reactor are combined to one pipe to be connected to the storage tank, or one pipe extended from the CVD reactor is separated and a plurality of the pipes are extended to the storage tank. In addition, by including one or more control valves, the pipe may be used to properly control a flow quantity or a flow speed of the silicon-containing gas introduced to the storage tank or to open and close the pipe.

In the step (4), the off-gas emitted in the depositing step is treated using methods such as purification, and may be sorted into trichlorosilane and tetrachlorosilane through a distillation process. Particularly, in the off-gas, dichlorosilane, hydrogen or hydrogen chloride may be additionally included in addition to unreacted trichlorosilane and a great quantity of tetrachlorosilane. The silicon-containing gas including tetrachlorosilane and trichlorosilane in the off-gas is identified to occupy approximately 20% to 30% in the total volume, and when reusing the silicon-containing gas in the polycrystalline silicon preparation process, it is identified that preparation efficiency of polycrystalline silicon significantly increases, and an average lifespan of the CVD reactor also increases by at least 50% compared to existing technologies.

In the step (5), after treating the off-gas, the treated gas is injected to the storage tank. The treated gas is mixed with the existing silicon-containing gas after being injected to the storage tank, and therefore, this is referred to as a mixture gas. The mixture gas is injected to the CVD reactor again and used in polycrystalline silicon deposition.

Ultimately, as disclosed in FIG. 1, the gas treated in the step (4) is included in the storage tank together with the silicon-containing gas prepared in the step (1) by a continuous process repeatedly carrying out a part or all of the steps (1) to (5), and the step (3) depositing polycrystalline silicon by injecting the mixture gas to the CVD reactor is repeated.

The mixture gas may be stored is stored as a liquid in the storage tank, and may be vaporized just before being injected to the reactor for CVD deposition. In this case, the mixture gas liquefied and stored in the storage tank moves to the CVD reactor through a pipe and is vaporized while passing through a means for vaporization, and then injected to the CVD reactor. If the mixture gas is stored in the storage tank in a gaseous state, a risk of leakage is present and it may be hard on the pipe and the like, and therefore, storage in a liquefied state is preferred. Particularly, when the mixture gas is stored in a liquefied state, more quantities of the mixture gas may be stored in the storage tank, which is also quite advantageous in terms of costs.

The mixture gas may be liquefied through pressurization under a room temperature condition, and in this case, increasing/decreasing a pressure in the storage tank may be achieved through injecting hydrogen or inert gas thereto and then controlling the injected amount. Herein, the mixture gas outlet of the storage tank may be located at the bottom of the storage tank, and hydrogen or the inert gas may be injected from the top of the storage tank.

The mixture gas may be vaporized through external or internal heat source supply. Examples of the external heat source include a heating means such as a heater or a boiler, and as the internal heat source, a method of using heat emitted of the step (4) by the off-gas emission may be used instead of installing a separate heater or a boiler. The place where the vaporization occurs is preferably where the mixture gas is injected to the CVD reactor of the step (3). In this case, providing a heat exchanger disposed neighboring the CVD reactor and flowing the off-gas and the liquefied mixture gas in the heat exchanger in a manner such as a countercurrent is preferred.

A volume ratio of trichlorosilane and dichlorosilane in the mixture gas supplied to the CVD reactor may be from 85% to 95% and from 8% to 13%, respectively. When depositing polycrystalline silicon using the mixture gas having the above-mentioned volume ratio, purity of the polycrystalline silicon is enhanced, and polycrystalline silicon having a uniform form is capable of being obtained despite of a fast deposition rate. As described above, the continuous recycling process according to the present invention maximizes deposition efficiency by maintaining the volume ratio of trichlorosilane and dichlorosilane in the mixture gas supplied to the CVD reactor in the above-mentioned numerical range of a volume ratio. A trace amount of tetrachlorosilane may be included in the mixture gas, however, regardless thereof, it is identified that the volume ratio of trichlorosilane and dichlorosilane is a most important managing point when depositing polycrystalline silicon. Particularly, including dichlorosilane in the above-mentioned range tends to enhance the deposition rate and reduce power consumption as well.

In addition, materials other than silane are expected to be present in extremely small amounts in the mixture gas, and this is due to the fact that high boiling point/low boiling point materials are treated through sufficient fractional distillation before being stored in the storage tank. Due to such a reason, the total volume ratio sum of trichlorosilane, dichlorosilane and tetrachlorosilane in the mixture gas is preferably 100%.

Some of the trichlorosilane present in the mixture gas is consumed on the polycrystalline silicon deposition under a specific process condition in the CVD reactor, however, the rest of trichlorosilane may not participate in the reaction, and is emitted as the off-gas together with the tetrachlorosilane, a product in the depositing step.

FIG. 2 is an additional embodiment of the present invention, and additionally includes steps (a) and/or (b) as steps of treating the collected off-gas. In order to recollect unreacted trichlorosilane in the off-gas and/or dechlorinating a great quantity of tetrachlorosilane to trichlorosilane, steps of (a) obtaining trichlorosilane through fractional distilling the off-gas and/or (b) obtaining trichlorosilane by dechlorinating tetrachlorosilane obtained through fractional distilling the off-gas may be included. The trichlorosilane obtained in the step (a) and/or step (b) may be injected together or individually to the storage tank. The trichlorosilane obtained therethrough may all be reused in the polycrystalline silicon depositing step.

In the step (b), a maximum economic benefit may be obtained by converting tetrachlorosilane present in a great quantity in the off-gas to trichlorosilane. The conversion is based on a dechlorination reaction of tetrachlorosilane, and main reaction formulae are as follows.

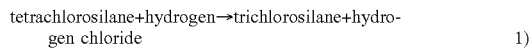

tetrachlorosilane+hydrogen→trichlorosilane+hydrogen chloride       1)

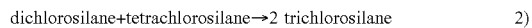

dichlorosilane+tetrachlorosilane→2 trichlorosilane       2)

In a dechlorination reactor used in an actual high purity trichlorosilane preparation process, the above-mentioned reaction 1) or 2) may occur alone or complexly. The dechlorination reaction of the present invention employs tetrachlorosilane and hydrogen as raw materials based on the reaction 1), however, dichlorosilane may also be included in the off-gas, and without additionally introducing dichlorosilane, trichlorosilane may be also obtained by the reaction 2) occurring simultaneously with the reaction 1).

Meanwhile, hydrogen incidentally obtained during the process of (a) obtaining trichlorosilane through fractional distilling the off-gas is collected and re-used as a reactant for preparing the silicon-containing gas (i.e., a silicon-containing gas including a silane mixture) of the step (1). Particularly, the reaction in the fluidized reactor is progressed based on a fluidization effect of hydrogen chloride, and the fluidization reaction will be accelerated by additionally introducing hydrogen into the fluidized reactor.

The reaction of dechlorinating tetrachlorosilane to trichlorosilane occurs in a dechlorination reactor equipped with a heating member and a heat exchanger, and FIG. 3 illustrates a dechlorination reactor (1) of the present invention.

A reactant gas (2) containing tetrachlorosilane and hydrogen is introduced to the dechlorination reactor (1), and on the peripheral region of the heated heating member (6), the reactant gas (2) reacts in a reaction region having a temperature of 900° C. to 1500° C. to produce a reaction product (3) including a trichlorosilane-containing gas.

The reactant gas (2) is introduced into the reactor through an inlet (7) located in an upper section of the dechlorination reactor (1), and the heating member (6) is heated to a final temperature to form a reaction region in which the reactant gas is capable of reacting. Herein, the heating member (6) may be made of a carbon or silicon material, and one or more of the heating members are arranged in parallel or in series and may be heated by an internal or external heat source. When the reactant gas (2) introduced to the dechlorination reactor (1) reaches the reaction region, the reaction product (3) is formed, and the reaction product (3) is transported to a heat-exchange region (provided with heat exchanger (4)) together with unreacted reactants. After that, the reactant gas (2) and the reaction product (3) go through mutual heat exchange in the heat exchanger (4) and then emit through an outlet (8). A preferred temperature of the reaction region (5) formed by radiant heat of the heating member (6) is from 900° C. to 1500° C. The reaction region (5) may include a part of the heat exchanger (4). In other words, it is identified that the reactant gas (2) present in a site satisfying a temperature condition capable of reacting in the heat exchanger (particularly, a part close to the heating member (5)) goes through a dechlorination reaction.

This may be identified by the presence of SiC deposited in the heat exchanger (4). SiC is formed by silicon being deposited in the heat exchanger (4) and reacting with carbon (C), a heat exchanger material, which means Si being produced, and indicates dechlorination of tetrachlorocarbon occurring in a part where a sufficient reaction temperature is formed in the heat exchanger. As described above, when a temperature of some regions in the heat exchanger (4) satisfies 900° C. to 1500° C. in addition to the high temperature reaction region (5), a dechlorination reaction may sufficiently occur.

The heat exchanger (4) has a region divided into a tube and a shell, and the heat exchanger (4) may be formed with materials selected from among silicon carbide, silicon nitride, quartz glass, graphite, SiC-coated graphite and combinations of these materials. The heat exchanger (4) may be located at the bottom or the top of the reactor, and may be attached to the reactor or combined to the reactor in an integrated structure. Particularly, the heat exchanger (4) may be divided by a baffle and the like, and in this case, the heat exchanger may be obtained in a form of combining a number of blocks, and FIG. 3 expresses such a heat exchanger structure and gas flow.

In the heat exchanger (4), the reactant gas (2) and the reaction product (3) move to each divided region, and do not meet or are not mixed with each other. FIG. 4 is a diagram of a heat exchanger (or heat exchanger block) having paths through which the reactant gas (2) and the reaction product (3) flow. FIG. 5 is a diagram showing that heat exchange occurs between the reactant gas (2) and the reaction product (3). Mutual heat exchange occurs as each material moves through paths represented by (a) or (b) in FIG. 5.

The reaction product (3) is cooled in a short period of time by the heat exchanger (4). It is actually identified that the reaction product (3) is cooled to 100° C. or lower within 0.1 seconds to 1 second while passing through the heat exchanger (4). Conversely, the reactant gas (2) injected to the dechlorination reactor (1) is heated by the reaction product (3).

The residence time of the reactant gas (2) in the dechlorination reactor (1) may be from 0.1 seconds to 10 seconds. The pressure in the dechlorination reactor (1) may be from 1 bar to 20 bars, and preferably from 1 bar to 5 bars. This is for a high pressure/high temperature condition for satisfying a reaction condition in the dechlorination reactor (1), and the above-mentioned ranges need to be satisfied although the values may vary depending on the internal structure.

The reaction product (3) emitted from the dechlorination reactor (1) is injected to the storage tank of the step (2), and stored in the storage tank after being mixed with the silicon-containing gas of the step (1) injected previously.

Meanwhile, the trichlorosilane-containing gas in the reaction product (3) emitted from the dechlorination reactor (1) may be additionally treated before being injected to the storage tank in order to remove impurities in the trichlorosilane-containing gas and to increase purity of trichlorosilane. Such a treatment process includes steps of (a) removing hydrogen and/or hydrogen chloride; and/or (b) fractional distilling trichlorosilane from the trichlorosilane-containing gas.

The process of (a) removing hydrogen and/or hydrogen chloride may be carried out using adsorption and desorption processes by controlling a temperature and a pressure. Hydrogen separated from the trichlorosilane-containing gas through the adsorption and desorption processes may be recollected and used in the dechlorination reaction of tetrachlorosilane. In addition, hydrogen chloride separated from the trichlorosilane-containing gas may be provided as a reactant for preparing the silicon-containing gas of the step (1), for example, a silicon-containing gas including a silane mixture.

The present disclosure will be described in more detail based on Examples 1 to 3 as follows.

EXAMPLE 1

A silicon-containing gas including silane was prepared by reacting MG-Si and hydrogen. In the silicon-containing gas, trichlorosilane, dichlorosilane and tetrachlorosilane were included, and volume ratios of the trichlorosilane, the dichlorosilane and the tetrachlorosilane after going through fractional purification were approximately from 95% to 98%, from 1% to 2% and from 0.1% to 1%, respectively, depending on temporal changes in the process. The silicon-containing gas was liquefied, stored in a storage tank, then vaporized, and injected to a CVD reactor to deposit silicon.

EXAMPLE 2

After carrying out Example 1, an off-gas emitted from the CVD reactor was collected. Herein, volume ratios of the trichlorosilane, the dichlorosilane and the tetrachlorosilane in the collected off-gas were approximately from 50% to 60%, from 5% to 10% and from 35% to 40%, respectively, depending on temporal changes in the process. The remaining part besides the silicon-containing gas was hydrogen and hydrogen chloride, which was approximately 99% and 1%, respectively. After that, the off-gas was additionally fractional distilled to obtain trichlorosilane with purity of 82.3%, and then this was injected to the storage tank storing the silicon-containing gas of Example 1 to store a mixture gas. Volume ratios of the trichlorosilane, the dichlorosilane and the tetrachlorosilane in the mixture gas were approximately from 83% to 90%, from 10% to 14% and from 1% to 4%, respectively, depending on temporal changes in the process. The mixture gas was injected to the CVD reactor to deposit silicon.

EXAMPLE 3

As in Example 2, an off-gas emitted in the CVD process was collected and fractional distilled to obtain tetrachlorosilane, and then the tetrachlorosilane was introduced into a dechlorination reactor together with hydrogen for a dechlorination reaction, and trichlorosilane was obtained.

In the dechlorination reactor, a heating member made of a carbon material was heated so as to maintain 1500° C., and while maintaining the pressure at 1 bar to 1.3 bars, a reactant gas of tetrachlorosilane 676 mL/h and hydrogen 2.64 l (STP)/h (l (STP): standard liter) was introduced to the dechlorination reactor through an inlet located at the top of the dechlorination reactor.

The reactant gas reacted in a reaction region of 900° C. to 1500° C. on the periphery of the heating member, and the reaction time was approximately 3 seconds. A reaction product passed through a heat exchanger together with unreacted reactants, and was cooled to 100° C. or lower (approximately 95° C.) within 0.3 seconds, and was emitted from the dechlorination reactor through an outlet.

After that, the reaction product was fractional distilled, and then injected to the storage tank of Example 2 to store a mixture gas. Herein, volume ratios of the trichlorosilane, the dichlorosilane and the tetrachlorosilane in the mixture gas were approximately from 87% to 92%, from 7% to 12% and from 0.1% to 2%, respectively, depending on temporal changes in the process. The mixture gas was injected to the CVD reactor to deposit silicon.

The rate of conversion from tetrachlorosilane to trichlorosilane in the dechlorination reactor provided in Example 3 was identified to be approximately from 10% to 17% based on the above-mentioned reaction time.

As the results of Examples 1 to 3, the time taken to be deposited to a certain diameter (100 mm) was calculated.

TABLE 1

| | Time Taken to Reach 100 mm of Diameter |
|---|---|
| Example 1 | 53 Hours |
| Example 2 | 49 Hours |
| Example 3 | 48 Hours |

Through the results, it was seen that, although a volume ratio of trichlorosilane in the mixture gas introduced during polycrystalline silicon deposition was an important factor, deposition efficiency was enhanced when including dichlorosilane as well in a certain amount or greater, and results were obtained using less trichlorosilane gas, and when including dichlorosilane in 8% to 13% based on a volume ratio, such a tendency was identified to be obtained.

It was identified that, as in Example 2 or 3, more polycrystalline silicon was able to be deposited using less raw materials based on trichlorosilane and tetrachlorosilane present in the off-gas.

As described above, the present invention enhances efficiency of a polycrystalline silicon preparation process by purifying unreacted trichlorosilane from an off-gas emitted from a CVD reactor, producing a high purity trichlorosilane-containing gas through dechlorinating tetrachlorosilane in the off-gas, separating the trichlorosilane-containing gas through a distillation process thereafter, and reusing this as a raw material in a depositing step.

While the present invention has been described with respect to the specific embodiments, it will be apparent to those skilled in the art that various changes and modifications may be made without departing from the spirit and scope of the invention as defined in the following claims.

REFERENCE NUMERAL

1: Dechlorination Reactor
2: Reactant Gas

3: Reaction Product (Produced Trichlorosilane-Containing Gas)
4: Heat-Exchange Region (Provided with Heat Exchanger)
5: Reaction Region
6: Heating Member
7: Inlet
8: Outlet
9: Baffle
(a): Moving Path of Reactant Gas
(b): Moving Path of Reaction Product

What is claimed is:

1. A process for producing polycrystalline silicon, comprising:
   (1) preparing a silicon-containing gas;
   (2) storing the silicon-containing gas of step (1) in a storage tank, said storage tank including a mixture of materials that include trichlorosilane and dichlorosilane;
   (3) depositing polycrystalline silicon by injecting said mixture of materials stored in the storage tank to a CVD reactor;
   (4) treating an off-gas emitted in the depositing step (3) to a) separate out trichlorosilane and dichlorosilane from the off-gas and/or b) produce trichlorosilane from tetrachlorosilane in the off-gas; and
   (5) injecting the trichlorosilane and the dichlorosilane obtained from the off-gas treated in the treating step (4) to the storage tank.

2. The process for producing polycrystalline silicon of claim 1, wherein a part or all of the steps (1) to (5) are repeatedly carried out.

3. The process for producing polycrystalline silicon of claim 1, wherein the silicon-containing gas produced from step (1) including high purity of trichlorosilane which is obtained by fractional distilling process.

4. The process for producing polycrystalline silicon of claim 1, wherein a mixture gas including the silicon-containing gas of the step (1) and the gas treated in the step (5) is stored as a liquid in the storage tank.

5. The process for producing polycrystalline silicon of claim 4, wherein the liquid in the storage tank is vaporized before being injected to the CVD reactor.

6. The process for producing polycrystalline silicon of claim 1, wherein the step (4) includes (a) obtaining trichlorosilane by fractional distilling the off-gas.

7. The process for producing polycrystalline silicon of claim 1, wherein the step (4) further includes (b) obtaining tetrachlorosilane by fractional distilling the off-gas, and then obtaining a trichlorosilane-containing gas by dechlorinating the tetrachlorosilane.

8. The process for producing polycrystalline silicon of claim 7, wherein the dechlorinating is introducing a reactant gas containing tetrachlorosilane and hydrogen to a dechlorination reactor in which a heating member made of a carbon or silicon material is located, and reacting the reactant gas in a reaction region forming a temperature of 900° C. to 1500° C. on the periphery of the heating member to obtain the trichlorosilane-containing gas.

9. The process for producing polycrystalline silicon of claim 8, wherein a residence time of the reactant gas in the dechlorination reactor is from 0.1 seconds to 3 seconds.

10. The process for producing polycrystalline silicon of claim 9, wherein a pressure in the dechlorination reactor is from 1 bar to 5 bars.

11. A process for producing polycrystalline silicon, comprising:
    (1) providing a silicon-containing gas, said silicon-containing gas including greater than 90 vol. % trichlorosilane;
    (2) feeding said silicon-containing gas of step (1) into a storage tank and feeding a recovered silicon-containing gas into said storage tank, said storage tank including a mixture of materials that include trichlorosilane and dichlorosilane, at least a portion of said dichlorosilane in said storage tank is supplied from said recovered silicon-containing gas;
    (3) depositing polycrystalline silicon by injecting said a mixture of trichlorosilane and dichlorosilane stored in the storage tank to a CVD reactor;
    (4) treating an off-gas emitted in said depositing step (3) to form said recovered silicon-containing gas, said step of treating said off-gas including a) separating out trichlorosilane and dichlorosilane from said off-gas and/or b) producing trichlorosilane from tetrachlorosilane in said off-gas; and
    (5) providing at least a portion of said recovered silicon-containing gas obtained from said off-gas treated in said treating step (4) to said storage tank.

12. The process as defined in claim 11, wherein said mixture of materials in said storage tank includes at least 83 vol. % trichlorosilane and at least 7 vol. % dichlorosilane.

13. The process as defined in claim 12, wherein said mixture of materials in said storage tank includes at least 0.1 vol. % tetrachlorosilane.

14. The process as defined in claim 13, wherein said mixture of materials in said storage tank includes 83-95 vol. % trichlorosilane, 7-14 vol. % dichlorosilane, and 0.1-4 tetrachlorosilane.

15. The process as defined in claim 11, wherein said treating said off-gas includes reacting tetrachlorosilane with hydrogen and/or dichlorosilane to produce dichlorosilane.

16. The process as defined in claim 12, wherein said treating said off-gas includes reacting tetrachlorosilane with hydrogen and/or dichlorosilane to produce dichlorosilane.

17. The process as defined in claim 11, wherein said silicon-containing gas includes at least 95 vol. % trichlorosilane.

18. The process as defined in claim 17, wherein said silicon-containing gas includes at least 95 vol. % trichlorosilane.

19. The process as defined in claim 11, wherein said step of treating said off-gas to produce trichlorosilane from tetrachlorosilane in said off-gas includes a) introducing said off-gas to a dechlorination reactor, said dechlorination reactor including a heating member made of a carbon or silicon material, b) reacting said tetrachlorosilane with hydrogen and dichlorosilane at a temperature of 900-1500° C. for 0.1-10 seconds at 1-20 bars to cause at least a portion of said tetrachlorosilane to form dichlorosilane.

20. The process as defined in claim 18, wherein said step of treating said off-gas to produce trichlorosilane from tetrachlorosilane in said off-gas includes a) introducing said off-gas to a dechlorination reactor, said dechlorination reactor including a heating member made of a carbon or silicon material, b) reacting said tetrachlorosilane with hydrogen and dichlorosilane at a temperature of 900-1500° C. for 0.1-10 seconds at 1-20 bars to cause at least a portion of said tetrachlorosilane to form dichlorosilane.

* * * * *